United States Patent
Szulyk et al.

(10) Patent No.: US 11,675,027 B2
(45) Date of Patent: Jun. 13, 2023

(54) MULTI-CHANNEL MAGNETIC SENSOR DEVICE

(71) Applicant: Woodward, Inc., Fort Collins, CO (US)

(72) Inventors: Zenon Szulyk, Fort Collins, CO (US); David M. Thunga, Fort Collins, CO (US); Kirill Goldin, Fort Collins, CO (US); Kevin Spahr, Fort Collins, CO (US)

(73) Assignee: Woodward, Inc., Fort Collins, CO (US)

(*) Notice: Subject to any disclaimer, the term of this patent is extended or adjusted under 35 U.S.C. 154(b) by 0 days.

(21) Appl. No.: 16/728,886

(22) Filed: Dec. 27, 2019

(65) Prior Publication Data
US 2021/0199731 A1   Jul. 1, 2021

(51) Int. Cl.
| | | |
|---|---|---|
| *G01R 33/07* | (2006.01) | |
| *G01D 5/14* | (2006.01) | |
| *G01R 33/09* | (2006.01) | |
| *G01R 15/20* | (2006.01) | |

(52) U.S. Cl.
CPC .......... *G01R 33/072* (2013.01); *G01D 5/145* (2013.01); *G01R 15/202* (2013.01); *G01R 15/207* (2013.01); *G01R 33/09* (2013.01)

(58) Field of Classification Search
CPC ..... G01R 33/072; G01R 15/202; G01D 5/145
See application file for complete search history.

(56) References Cited

U.S. PATENT DOCUMENTS

| | | | |
|---|---|---|---|
| 5,945,746 A | 8/1999 | Tracewell et al. | |
| 2002/0190709 A1* | 12/2002 | Frederick | G01D 5/24438 324/207.2 |
| 2009/0315547 A1* | 12/2009 | Abwa | G01R 33/02 324/244 |
| 2012/0038359 A1* | 2/2012 | Saruki | G01R 33/093 324/252 |
| 2012/0146627 A1* | 6/2012 | Masson | B62D 15/0245 324/207.21 |
| 2014/0077922 A1 | 3/2014 | Horiguchi et al. | |
| 2015/0226581 A1* | 8/2015 | Schott | G01D 5/145 324/207.2 |
| 2017/0122779 A1* | 5/2017 | Krishna | B64C 13/0421 |
| 2017/0302207 A1 | 10/2017 | Goossens et al. | |
| 2018/0087889 A1* | 3/2018 | Ausserlechner | G01B 7/30 |
| 2018/0172421 A1* | 6/2018 | Hoell, Jr. | G01D 5/145 |
| 2019/0170628 A1* | 6/2019 | Salomon | G01N 11/14 |

OTHER PUBLICATIONS

Int'l Search Report and Written Opinion Appln No. PCT/US2020/063040 dated Feb. 22, 2021.

* cited by examiner

*Primary Examiner* — Noam Reisner
(74) *Attorney, Agent, or Firm* — McAndrews, Held & Malloy, Ltd.

(57) ABSTRACT

Methods and systems for a rotary contactless potentiometer device, which includes one or more sensors, such as a Hall Effect sensor. The sensors are mounted on one or more substrates, such as a printed circuit board (PCB). In examples, each sensor channel is electrically isolated on the substrate. The sensors are arranged within range of a magnetic field, such as from a magnet rotatable about a shaft. The potentiometer device is housed in a frame to reduce stray magnetic interference.

20 Claims, 9 Drawing Sheets

MULTI-CHANNEL MAGNETIC SENSOR DEVICE

FIELD

Certain embodiments of the disclosure relate to multi-channel magnetic sensor device. More specifically, certain embodiments of the disclosure relate to a rotary, contactless potentiometer employing one or more three-channel Hall Effect sensors, each with one or more wires, two or more redundant channels, a DC input and output, and ratiometric linear voltage output.

BACKGROUND

In many sensitive applications, contacting potentiometers are used, as they provide an inexpensive way to track and measure movement, etc. For example, contacting potentiometers are devices that utilize a wiper contacting a resistive track to provide a measurement and output signal. However, contacting elements in a potentiometer sensor will wear out over time, thereby shortening the lifespan of the device and potentially failing during critical operations. Additionally, contact potentiometers cannot be reliably used in high-vibration environments. A solution to the use of contacting potentiometers in sensitive applications is therefore desirable.

Further limitations and disadvantages of conventional and traditional approaches will become apparent to one of skill in the art, through comparison of such systems with the present disclosure as set forth in the remainder of the present application with reference to the drawings.

BRIEF SUMMARY

A system and/or method is provided for a rotary contactless potentiometer device, which includes one or more multi-channel sensors, such as Hall Effect sensors. The sensors are mounted on one or more substrates, such as a printed circuit board (PCB). In examples, each sensor channel is electrically isolated on the substrate. The sensors are arranged within range of a magnetic field, such as from a magnet rotatable about a shaft. The potentiometer device is housed in a frame to reduce stray magnetic interference.

In disclosed examples, a contactless potentiometer device includes a plurality of sensors mounted on one or more substrates, each sensor configured to measure change in a magnetic field and to be physically and electrically isolated from another sensor. A ring magnet is positioned a distance from the one or more sensors, such that the one or more sensors are within range of the magnetic field from the magnet.

In some examples, the plurality of sensors comprises one or more Hall Effect sensors. In examples, each of the plurality of sensors is aligned with a central magnetic axis of the magnetic field.

In some examples, the output signal changes in proportion to a change to an input signal. In examples, each sensor detects a change in angle from a reference position based on a rotation of the magnet about the shaft.

In some examples, the one or more substrates are one or more printed circuit boards (PCBs). In examples, the two or more of the PCBs are physically separated by a predetermined distance. In examples, the ring magnet is rotatable about a shaft.

In some examples, a housing to contain the one or more sensors, the magnet, or the shaft, wherein rotational movement about the shaft is facilitated by one or more of ball bearings, bushings, tracks, or a rotary support structure. In examples, the housing includes a panel to provide access to the substrate, the one or more sensors, and/or the magnet. In examples, the housing comprises a material to block stray magnetic fields.

In disclosed examples, a rotary sensing device configured to sense changes in angle in a rotary sensor includes a plurality of sensors mounted on one or more substrates, each sensor configured to measure change in a magnetic field and be electrically isolated from another sensor. A magnet is positioned a distance from the one or more sensors, such that the one or more sensors are within range of the magnetic field from the magnet, wherein each sensor is configured to detect a change in angle from a reference position based on a rotation of the magnet.

In some examples, each of the one or more sensors are equally spaced apart from one another and offset from the magnetic center of magnet by a predetermined distance. In examples, the magnet is a ring magnet.

In examples, each of the one or more sensors includes a power input to receive a DC voltage and an output to provide a signal corresponding to the change in the magnetic field.

In examples, two of the one or more Hall Effect sensors are located on a first side of the common substrate and one or more Hall Effect sensors are located on a second side of the substrate. In examples, the two Hall Effect sensors located on the first side of the substrate are both equidistant from a central magnetic axis of the magnetic field. In examples, the one or more Hall Effect sensors located on the second side of the substrate is arranged on the central magnetic axis.

In disclosed examples, a method of programming a contactless potentiometer device includes arranging a first magnetic sensor on a substrate, aligning the first magnetic sensor with a magnetic field corresponding to a given rotation angle of a rotatable control device, programming the first magnetic sensor with linearization data corresponding to the given rotation angle, arranging a second magnetic sensor on the substrate, aligning the second magnetic sensor with the first magnetic sensor, and programming the second magnetic sensor with linearization data corresponding to the given rotation angle. In some examples, the method includes replacing a rotary variable differential transformer (RVDT) with the contactless potentiometer device.

These and various other advantages, aspects and novel features of the present disclosure, as well as details of an illustrated embodiment thereof, will be more fully understood from the following description and drawings.

BRIEF DESCRIPTION OF SEVERAL VIEWS OF THE DRAWINGS

The figures are not necessarily to scale. Where appropriate, similar or identical reference numbers are used to refer to similar or identical components.

DETAILED DESCRIPTION

As utilized herein, "and/or" means any one or more of the items in the list joined by "and/or". For example, "x and/or y" means any element of the three-element set {(x), (y), (x, y)}. Similarly, "x, y, and/or z" means any element of the seven-element set {(x), (y), (z), (x, y), (x, z), (y, z), (x, y, z)}. As utilized herein, the term "module" refers to functions that can be implemented in hardware, software, firmware, or any combination of one or more thereof. As utilized herein, the term "exemplary" means serving as a non-limiting example, instance, or illustration.

Figure 1:
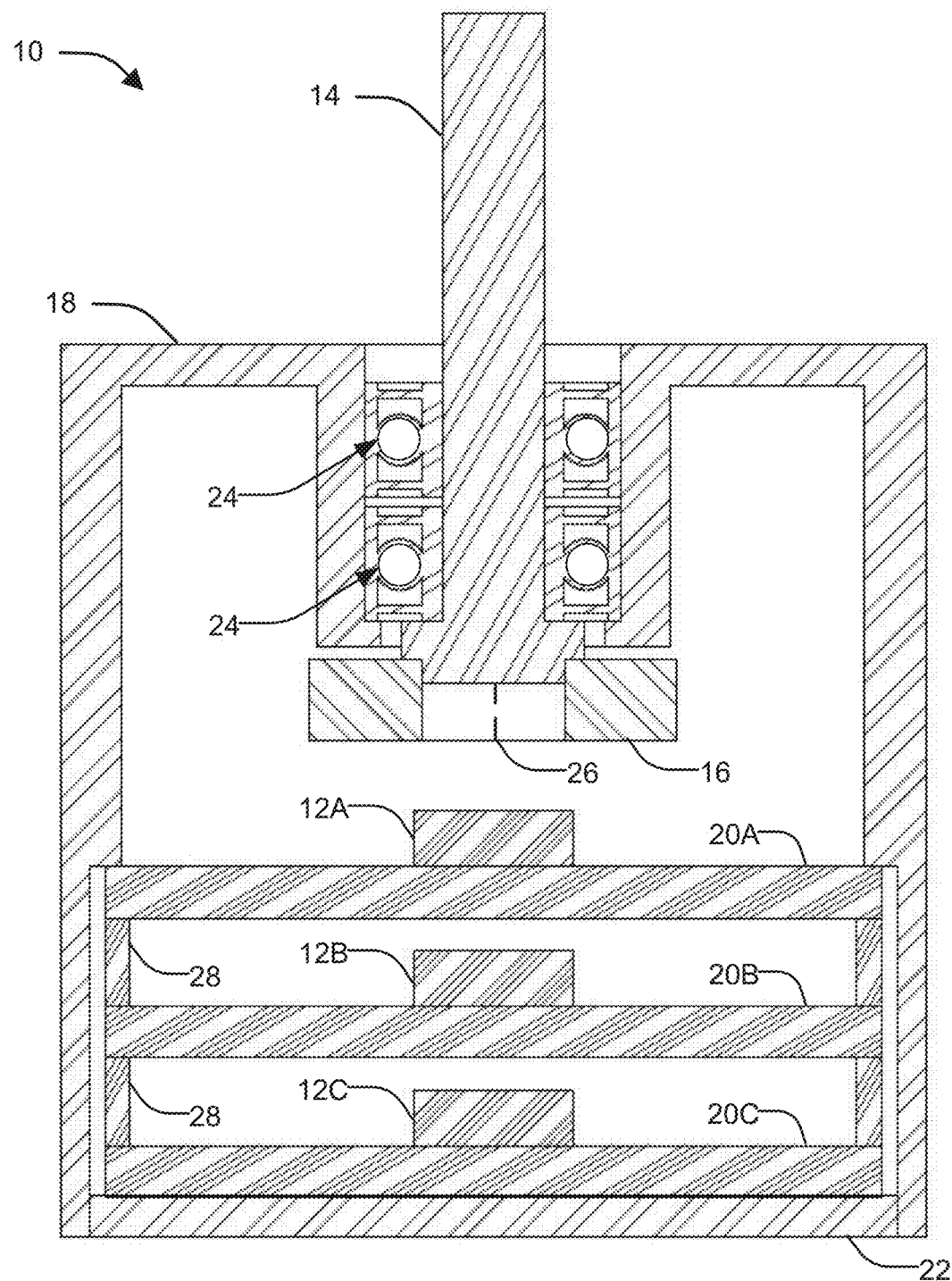
FIG. 1 is a lateral view of a multi-channel sensor device, in accordance with an example embodiment of the disclosure.

FIG. 1 provides an illustration of an example rotary contactless potentiometer device 10. The potentiometer device 10 includes one or more sensors 12A, 12B, 12C, such as a multi-channel Hall Effect sensor. The sensors 12A-12C can be mounted on one or more substrates 20, such as a printed circuit board (PCB). The potentiometer device 10 in the example of FIG. 1 includes three PCBs 20A, 20B, 20C, each PCB stacked a given distance from the magnet 16. The sensors 12A-12C can be arranged within range of a magnetic field, such as from a magnet 16 (e.g., a rotatable magnet). In some examples, the magnet 16 is a permanent magnet rotatable about a shaft 14. Rotational movement about the shaft 14 is facilitated by one or more ball bearings 24, bushings, tracks, or a rotary support structure. The potentiometer device 10 can be housed in a frame or housing 18. In some examples, the housing 18 includes a panel 22, which provides access to the PCB 20 to allow removal and/or maintenance on the components within.

Figure 1A:
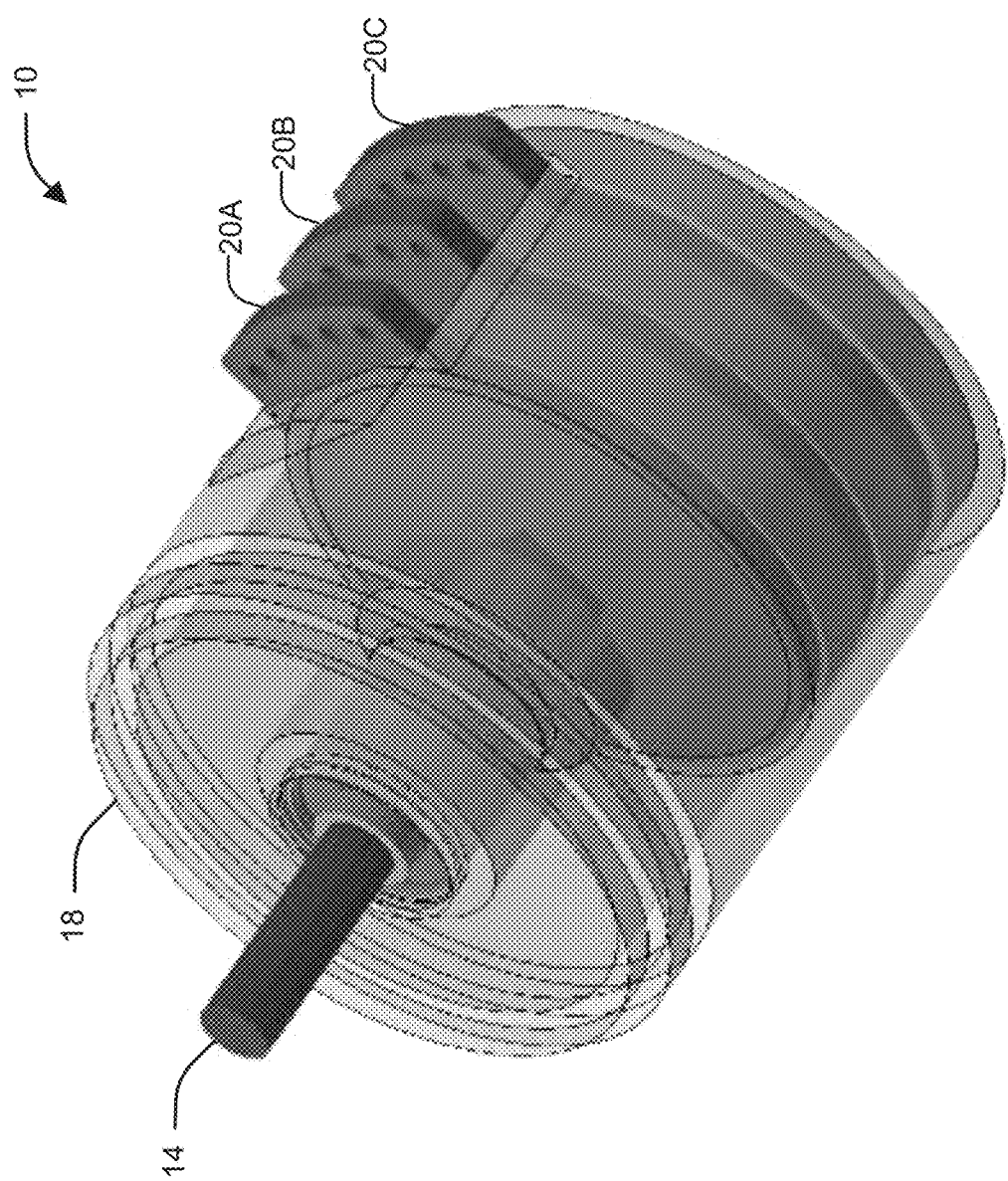
FIG. 1A is a perspective view of the multi-channel sensor device of FIG. 1, in accordance with an example embodiment of the disclosure.

As shown in FIG. 1, each PCB 20 supports a single Hall Effect sensor 12A-12C. The Hall Effect sensor on each PCB 20A-20C is arranged directly on the axis of the magnet shaft 14 and the magnetic center 26, thus reducing nonlinearities in sensor output in comparison to offset sensor placement (shown in FIGS. 3 and 4). However, as PCB 20A is closer to the magnet 16 than PCB 20B, which is closer to the magnet 16 than PCB 20C, sensor 12A experiences a stronger magnetic field than sensor 12B, which experiences a stronger magnetic field than sensor 12C. For example, each sensor channel is electrically and physically isolated on an independent circuit board 20A-20C, thus reducing common-mode failures. As disclosed herein, programming is provided to optimize signal fidelity from the various outputs in view of the relative strength of the magnetic field at the respective sensor. FIG. 1A provides an illustration of a perspective view of the three-channel Hall Effect sensor 10 shown in FIG. 1.

The potentiometer device 10 disclosed herein improves sensor accuracy by employment of magnet 16 coupled with one or more sensors in one of several arrangements. The potentiometer device 10 is configured to employ programmable calibration to linearize voltage output for each of the sensors. This also allows design scalability for more/fewer channels and a common power conditioning board to accommodate different input requirements. Thus, the disclosed potentiometer device 10 provides advantages over other systems that include Hall Effect sensors in mechanical layouts, which often fail to improve system accuracy, or require use of an electronics packaging architecture, which is susceptible to common-mode failures.

In disclosed examples, the rotary contactless potentiometer device 10 includes sensors having multiple wires (e.g., three or four wires), with multiple redundant channels associated with a respective sensor 12A-12C. In some examples, the device operates with a DC input and a DC output with ratiometric linear voltage output. In disclosed example, the potentiometer device 10 is applicable in a sidestick application to sense pilot commands corresponding to a desired angle of pitch and/or roll axes of an aircraft.

For example, in an aircraft cockpit environment, a sidestick or sidestick controller is an aircraft control column (or joystick) that is located on the side console of the pilot. Only one hand is required to operate the sidestick, which makes it a simple and intuitive tool to control pitch and/or roll of an aircraft. Although examples are provided with respect to a sidestick application, aircraft controls mounted in control columns may be arranged in a center of the cockpit. Moreover, applications beyond aerospace, and beyond control mechanisms, are considered as well.

During operation, the device 10 is designed to meet or exceed sidestick accuracy requirements. Furthermore, the device is designed to operate as ratiometric, such that an output signal changes in proportion to a change to an input signal (e.g., voltage).

Conventional technology uses a rotary variable differential transformer (RVDT) or contacting potentiometers, with a wiper coupled with a resistive track. Although RVDTs are more reliable than contacting potentiometers and are capable of higher resolution, they are limited by an AC input/output. This limitation inhibits the use of an RVDT as a replacement for legacy systems that employ contacting potentiometers that operate with a DC input and output. Further, RVDTs are expensive and complex to manufacture, and require complex drive signals and output decoding, compared to contacting potentiometers.

The disclosed rotary contactless potentiometer device 10 is designed to imitate the electrical characteristics of a contacting potentiometer, but employs contactless technology to increase performance and extend device lifespan. For example, the potentiometer device 10 has multiple redundant channels (e.g., three), each with isolated electrical outputs, which meet or exceed regulatory guidelines for sensor redundancy in a sidestick application.

Additionally or alternatively, a ring magnet may be employed, which provides higher accuracy than other types of magnets. A ring magnet with sensors arranged above or below the ring magnet is more accurate due in part to improved symmetry in the magnetic field experienced by the sensors 12A-12C relative to the magnetic center 26.

Other types of magnets considered for substitution with the example ring magnet could be, for example, a disc magnet, a non-symmetric magnet, a four-pole magnet, to name a few. Different magnet types may offer different operational outcomes, such as non-symmetric magnets or four-pole magnet could provide improved linearization and/or immunity to electromagnetic noise.

As described herein, the potentiometer device 10 may be used as a substitute for a conventional RVDT sensor (e.g., in an aircraft sidestick application). Therefore, a potentiometer device 10 may be constructed as a retrofit device, with a package designed to fit a legacy device, as well as accept inputs (e.g., DC voltage) and provide outputs (e.g., a ratiometric DC voltage), consistent with the device being replaced. The potentiometer device 10 can be designed to emulate the output signal of an RVDT/resolver. This may offer a direct substitution of channels, and/or may be implemented with configurable and/or additional circuitry. In some examples, the housing 18 of the device 10 is constructed to be similar to the housing of an RVDT. The ring magnet 16 can be secured to the shaft 14 using one or more fasteners, such as a bolt, a custom washer, a threaded shaft end, among other solutions. The PCBs 20A-C can be retained by a fastener or other means, such as an end cap 22, which can apply an axial load against the sensor housing 18.

In the example of FIG. 1, each PCB is separated by one or more spacers 28 or other mounting device to ensure the PCBs and/or sensors are physically isolated. In some examples, the spacers 28 are of a substantially similar size, such that the distance between each PCB is approximately equal. In other examples, one or more of the spacers 28 have different sizes, such that the distance between two PCBs is different.

The potentiometer device 10 offers a low cost, high accuracy, and reliable alternative to other solutions, such as RVDTs, resolvers, and/or wiper potentiometers. RVDTs are the most common contactless solution to the problem described in cockpit applications. They utilize a magnetic rotor in a wound and laminated stator. In some examples, the output signals of the potentiometer device 10 can be manipulated so the device is capable of direct replacement with legacy sensors (e.g., RVDTS). Previous solutions have failed to emulate the output signal of an RVDT or resolver, making direct replacement impractical or impossible.

Further, although examples are provided with respect to applications in a flight deck (e.g., a sidestick application), the technology and platform may be useful in a variety of applications in aerospace, manufacturing, automotive, rotation sensing, electronic sports, virtual gaming, or transportation, to list but a few. In examples, the disclosed sensing technology can be employed in joystick applications, such as large industrial equipment (e.g., construction, agriculture, etc.), gaming, or other applications that employ a rotary control.

Another implementation of the disclosed technology is a direct integration into an intended application (e.g. embed Hall Effect sensor(s) into a sidestick without isolated packaging but directly on a rotating component therein). This may further reduce cost, and is a solution that would be impractical with wound components (such as RVDTs/resolvers).

Additionally or alternatively, the disclosed Hall Effect sensor advantageously reduces interference from stray magnetic fields through a magnetically-shielded housing design. In some examples, operational power for signals within the device 10 may be limited to decrease emitted stray magnetic fields beyond the housing 18.

In some examples, a magnet can be arranged between two boards, such that one or more magnetic sensors are located above the magnet, and one or more magnetic sensors are located below the magnet. Thus, each of the magnetic sensors above and below the magnet would experience a magnetic field of the same strength.

Figure 2A:
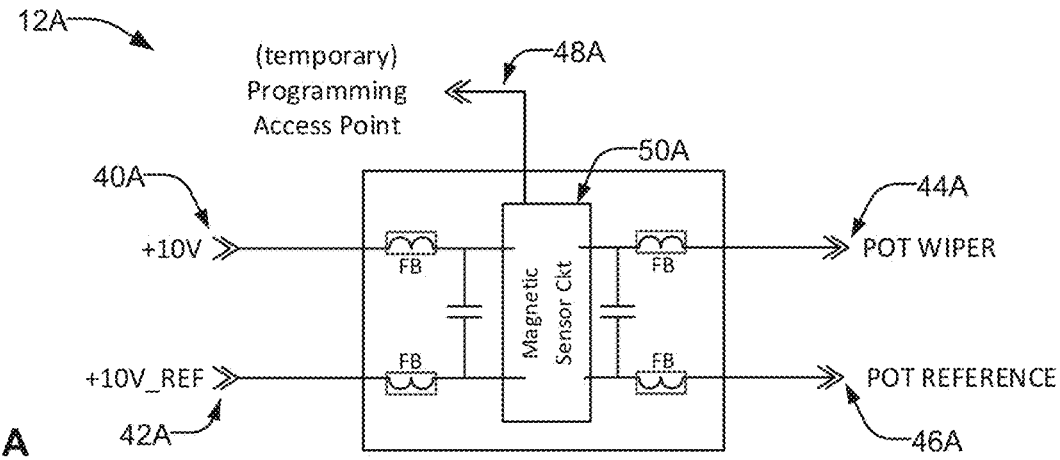
FIGS. 2A-2C illustrate schematics of multi-channel sensors, in accordance with an example embodiment of the disclosure.
Figure 2B:
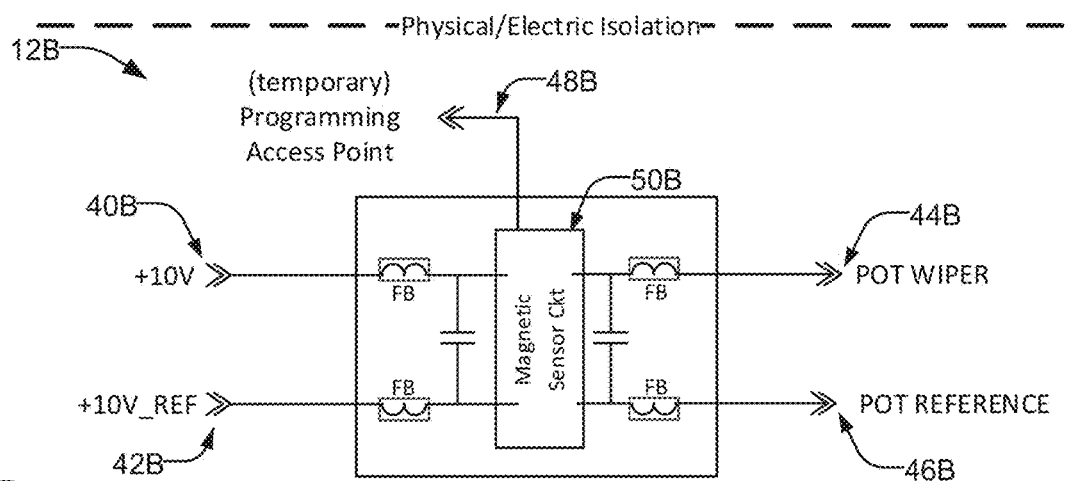
Figure 2C:
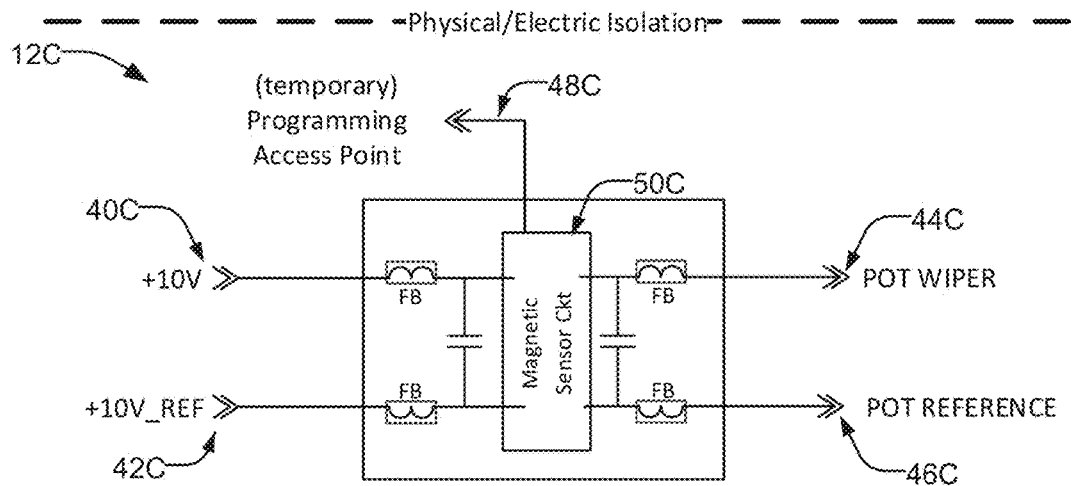

FIGS. 2A, 2B and 2C illustrate three physically and electrically isolated magnetic sensor circuits that emulate a traditional potentiometer (e.g., a contact potentiometer). For example, each magnetic sensor circuit corresponds to one of the sensors 12A-12C. Each sensor includes a programming access point 48A-48C, which can be used to program and/or calibrate the sensor with respect to the magnetic center 26. The magnetic sensor circuit 50A-50C includes components to respond to and/or measure changes in the magnetic field from magnet 16. Those changes are output to a circuit and/or controller via three electrically isolated channels, for example. The magnetic sensor circuit 50A-50C may also include a writable memory, to be programmed with linearization data corresponding to a given rotation angle (e.g., a reference or null position) of a rotatable control device, such as following a calibration process.

In some examples, each multi-channel sensor has an independent differential output 44A-44C with respect to 46A-46C, with an independent differential input 40A-40C with respect to 42A-42C having a bias of about 6.0 VDC or 30.0 VDC. In examples, the output is a ratiometric output having a scale factor within a configurable range. Each Hall Effect sensor 12A-12C is designed to draw a limited amount of power (e.g., 5-15 mA per sensor channel) in an effort to minimize input current and/or stray magnetic field emissions.

Although three potentiometer circuits (e.g., sensors) are illustrated in FIGS. 2A-2C, as few as one potentiometer circuit or more than three potentiometer circuits may be employed in the design of the rotary potentiometer device disclosed herein.

Figure 3:
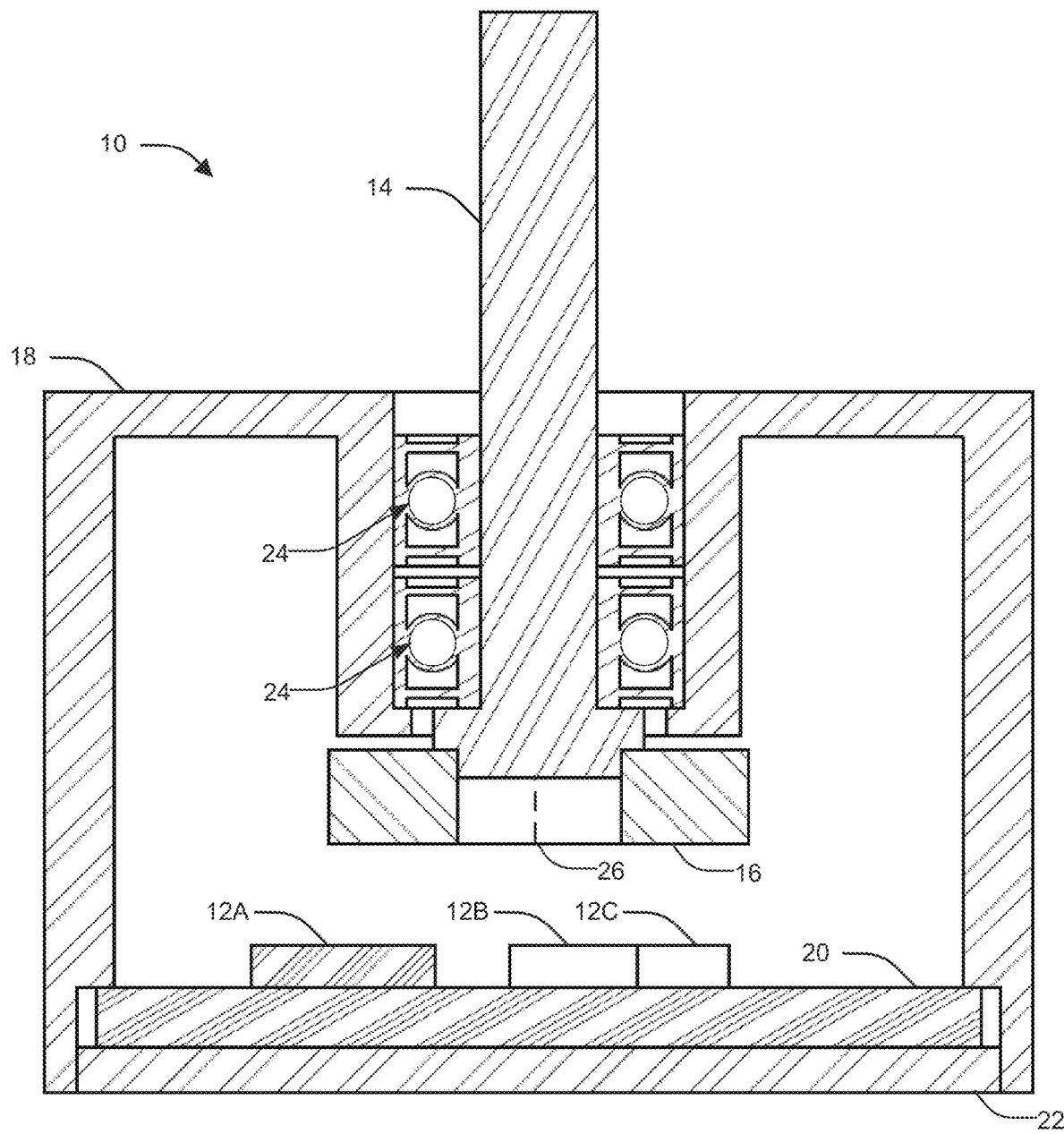
FIG. 3 is a lateral view of another multi-channel sensor device, in accordance with an example embodiment of the disclosure.

FIG. 3 provides an illustration of another example rotary contactless potentiometer device 10. The potentiometer device 10 includes one or more sensors 12A, 12B, 12C, such as a multi-channel Hall Effect sensor. The sensors 12A-12C can be mounted on a substrate 20, such as a printed circuit board (PCB). The sensors 12A-12C can be arranged within range of a magnetic field, such as from a magnet 16 (e.g., a rotatable magnet). In some examples, the magnet 16 is a permanent magnet rotatable about a shaft 14. Rotational movement about the shaft 14 is facilitated by one or more bushings or ball bearings 24. The potentiometer device 10 can be housed in a frame or housing 18. In some examples, the housing 18 includes a panel 22, which provides access to the PCB 20 to allow removal and/or maintenance on the components within.

Figure 3A:
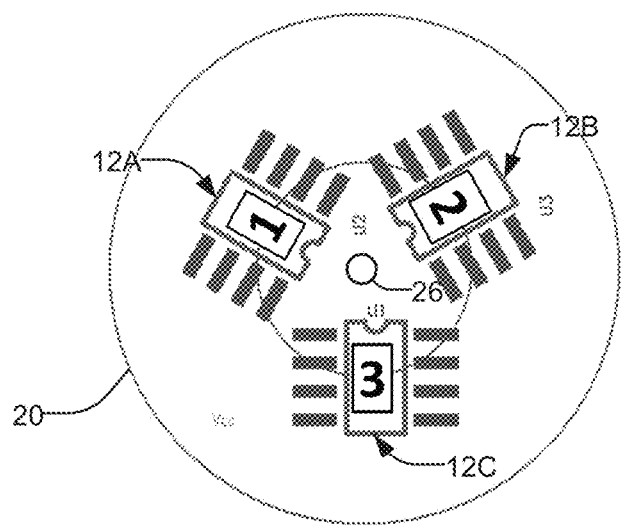
FIG. 3A illustrates a schematic of a printed circuit board that includes multi-channel sensors, in accordance with an example embodiment of the disclosure.

As shown in FIG. 3, the potentiometer device 10 uses a magnet 16 on dual bearing supports (facilitated by ball bearings 24). The example arrangement shown in FIG. 3A employs three electrically isolated Hall Effect sensors 12A-12C arranged on PCB 20. For example, the Hall Effect sensors can be spaced 120 degrees apart from one another and offset from the magnetic center of magnet 16 by a predetermined distance. The arrangement can be informed by the size of the Hall Effect sensors 12A-12C, the size of the housing 18, a particular application (e.g., as an airplane sidestick), among others.

As the sensors 12A-12C are offset from the magnetic center, each sensor output may experience nonlinearities. For example, nonlinearities in Hall Effect sensor output may become apparent when placing the sensor circuit offset from the magnet center 26. As disclosed herein, nonlinearities can largely be programmed out using software; however, some electronics packaging schemes allow higher accuracy than others. Thus, the sensors are programmed using a linearization process, which aligns each sensor channel of sensors 12A-12C electrically based on relative position to magnetic axis 26, thereby avoiding the need for manual adjustment required by conventional technology, which can be inaccurate, time consuming, and subject to error.

Figure 4:
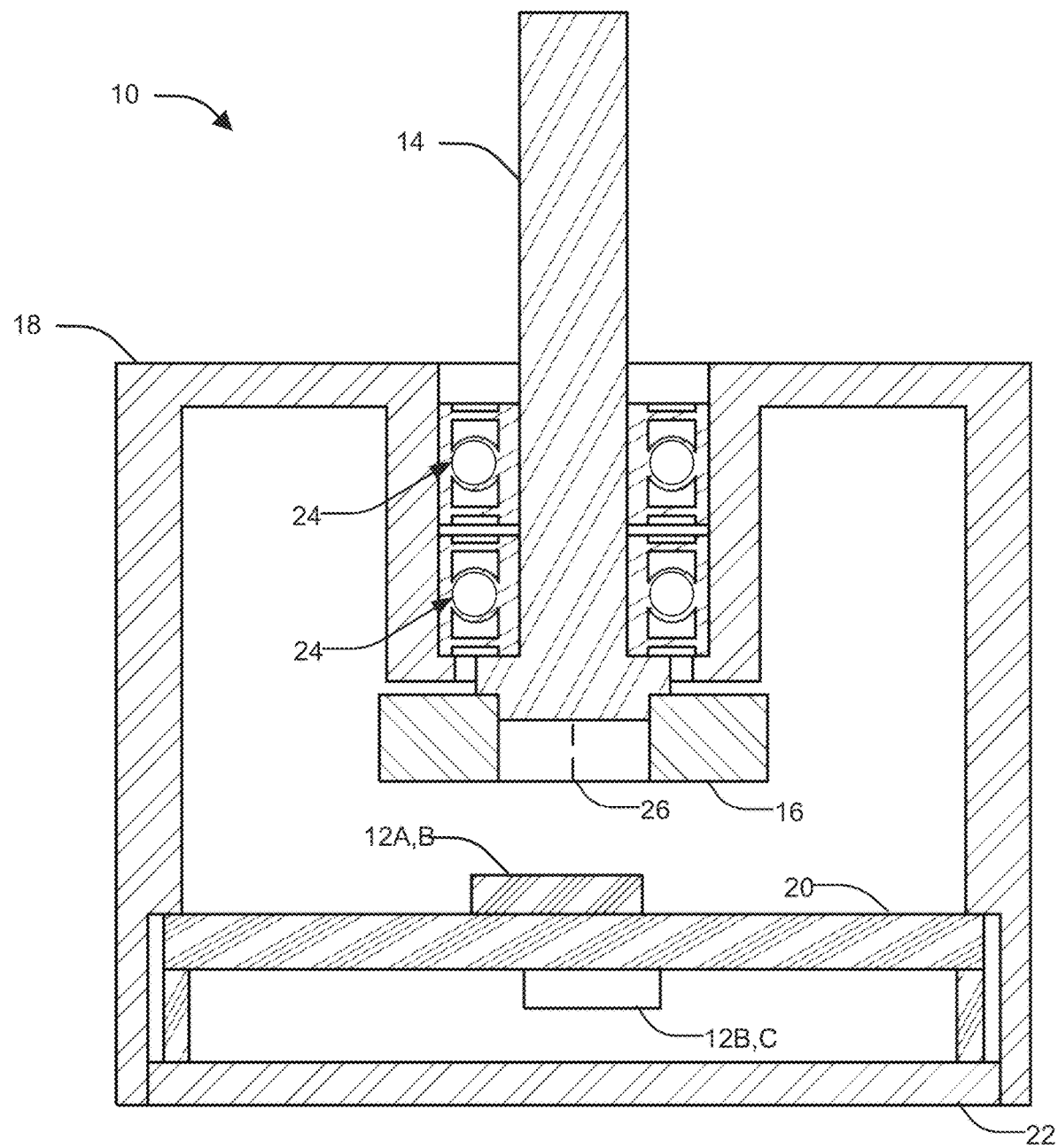
FIG. 4 is a lateral view of another multi-channel sensor device, in accordance with an example embodiment of the disclosure.
Figure 4A:
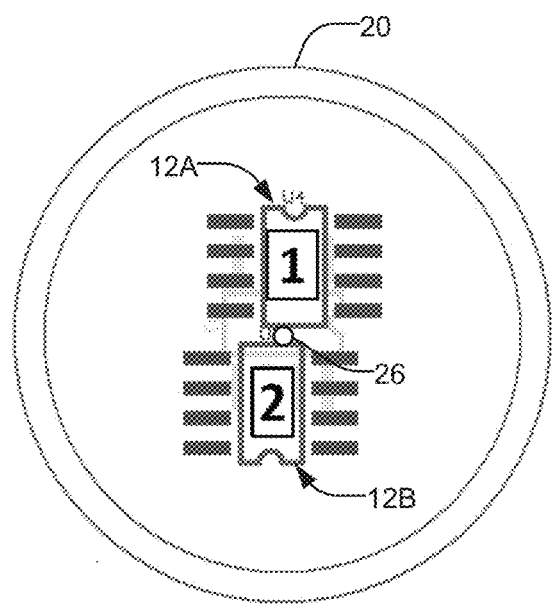
FIGS. 4A and 4B illustrate a schematic of a printed circuit board that includes multi-channel sensors, in accordance with an example embodiment of the disclosure.
Figure 4B:
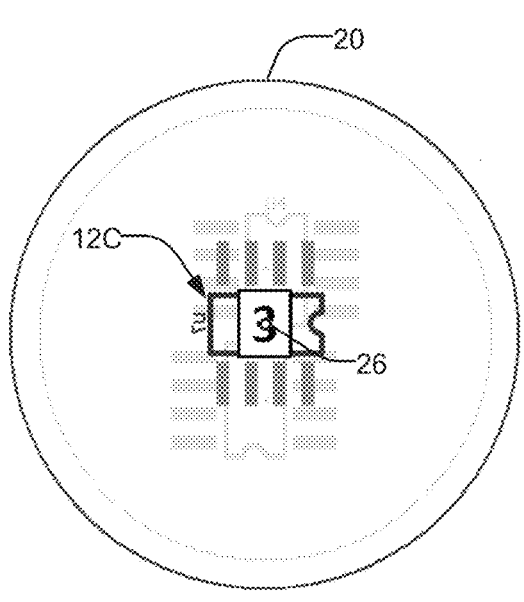

FIG. 4 provides an illustration of another example rotary contactless potentiometer device 10, where one or more sensors 12A-12C are arranged on a first side of PCB 20, and one or more sensors 12A-12C are arranged on a second side of the PCB 20 opposite the first side. As shown in FIG. 4A, in an example where two sensors 12A and 12B are arranged on the first side, the sensors are offset by 180 degrees about the magnetic center 26. A third sensor 12C can be mounted on the second side, directly aligned with the magnetic center 26. The arrangement of sensors illustrated in FIG. 4A is designed to experience limited nonlinearities, due to the sensors being arranged closer to the magnetic center 26, and one sensor arranged directly on the center of the magnet rotation.

In some examples, the output signal from the Hall Effect sensors is used to modulate the incoming input voltage so as to provide a ratiometric output over a wider input range than an unmodulated signal (e.g., approximately 4.5V to 30V). The expanded range allows the contactless rotary potentiometer sensor to be used in pot-replacement applications operating from a variety of voltage rails, such as 10V, 12V, or 24V (e.g., common in industrial applications), and from 28V (e.g., common in aerospace applications).

In examples, the operating stroke of the device (e.g., in response to movement of the shaft) is approximately +/−100 degrees from a null position, but can have a greater or smaller range depending on the application or desired performance. Furthermore, the arrangement of sensors, selection of sensor type, and/or calibration process results in a low error rate during deployment (e.g., between +/−0.1% and +/−0.9% full-scale error at a null position; between +/−1.0% and +/−3.0% full-scale error at extreme positions).

In some examples, the potentiometer device 10 and the associated multi-channel sensors are configured to operate in a temperature range of approximately −40 C to approximately +70 C, although the range of suitable operating temperatures may be expanded based on material type, sensor selection, or other engineering principles.

Figure 5:
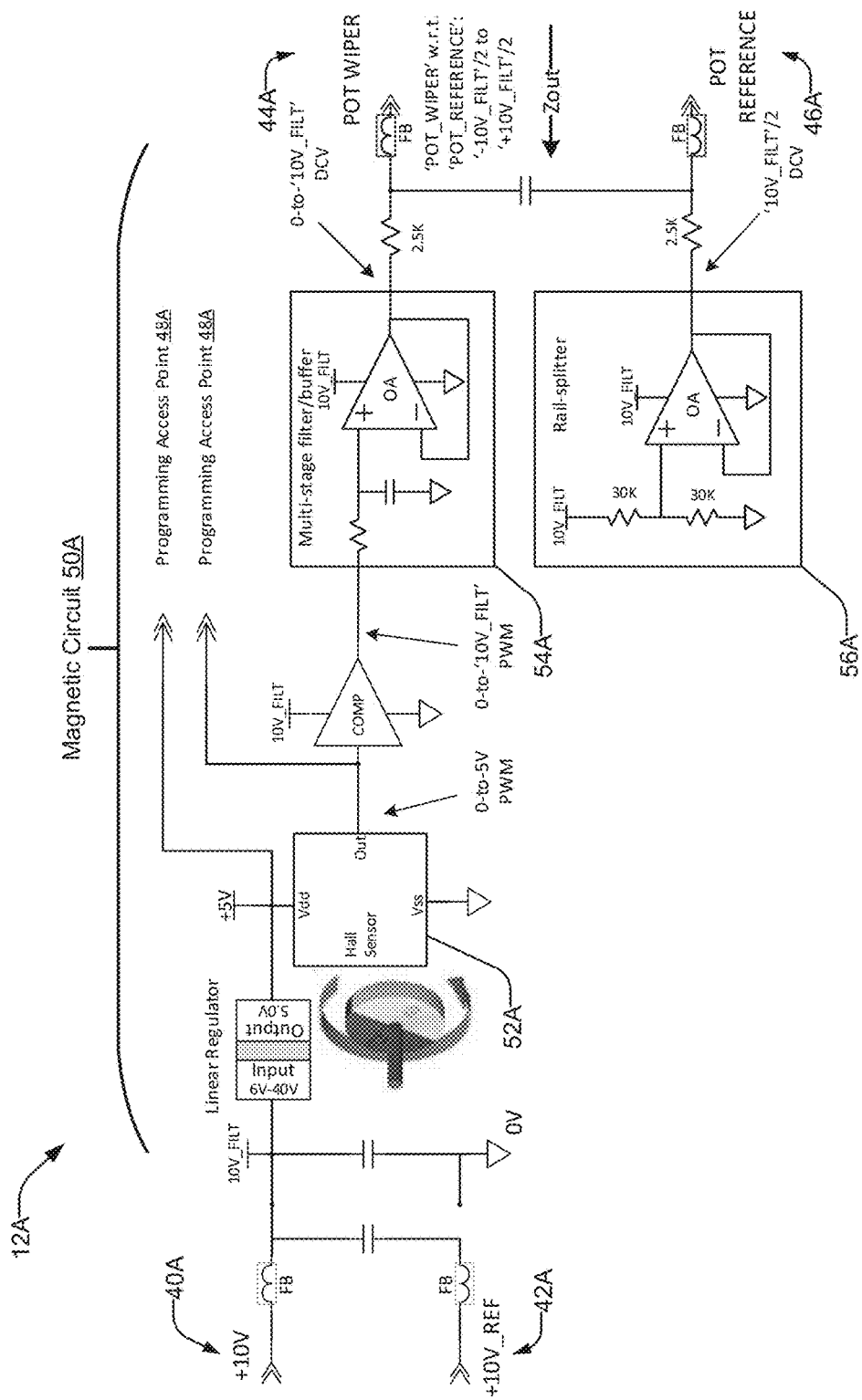
FIG. 5 illustrates a schematic of a multi-channel sensor, in accordance with an example embodiment of the disclosure.

FIG. 5 illustrates a schematic of an example circuit to implement the contactless potentiometer device disclosed herein. As shown, components of sensor 12A are provided in greater detail. For example, magnetic circuit 50A includes a Hall Effect sensor integrated circuit 52A, which can be in some examples used to replace an existing potentiometer (such as a contacting potentiometer). The voltage input 40A and 42A, the POT wiper 44A and the POT reference output 46A are arranged such that the magnetic circuit 50A can be connected to existing potentiometer inputs and generate a potentiometer output in a straightforward swap of parts. As shown, a multi-stage filter/buffer 54A and a mid-point buffer 56A ensure an applicable output voltage. As shown, the output impedance can be configured to be similar to an existing potentiometer output, and may also provide noise filtering.

Figure 6:
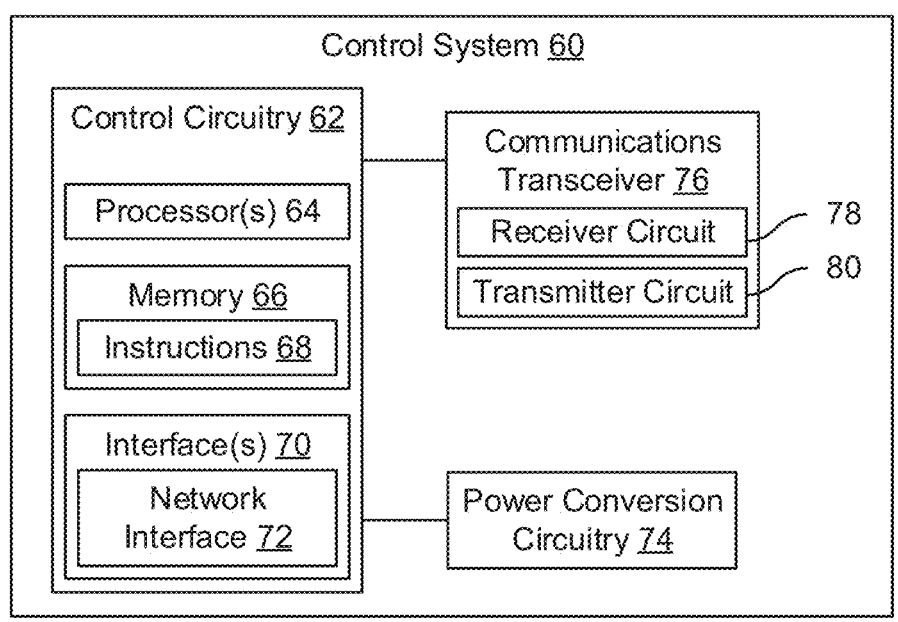
FIG. 6 illustrates a schematic of a control circuit to control a multi-channel sensor, in accordance with an example embodiment of the disclosure.

FIG. 6 illustrates an application schematic of a control system 60 using a potentiometer device, in accordance with an example embodiment of the disclosure. Referring to FIG. 6, the control system 60 may include control circuitry 62, which may further include a processor 64 operable to receive input signals from the one or more sensor(s) 12A-12C. These and other inputs can be received via one or more interfaces 70, including a wired and/or wireless network interface 72. In some examples, signals may be received via one or more communications transceivers 76, such as one or more dedicated receiver circuits 78 and/or transmitter circuits 80. Power conversion circuitry 74 may be employed to scale up or scale down input or output signals for processing or transmission, etc. Advantageously, circuitry associated with control system 60 is configured to receive signals from a conventional POT wiper output and/or reference inputs, and is similarly equipped to receive signals from the Hall Effect sensors 12A-12C as disclosed herein. Accordingly, the control system 60 is configured to interface with the contactless potentiometer device(s) disclosed herein without the need to modify, add to, and/or upgrade circuitry for such highly sensitive and highly reliable Hall Effect sensors.

A memory 66 may store instructions 68, which may include algorithms to perform programming and/or calibration techniques, monitor and analyze signals from sensor outputs, and/or transmit data and/or commands based on incoming signals.

Figure 7:
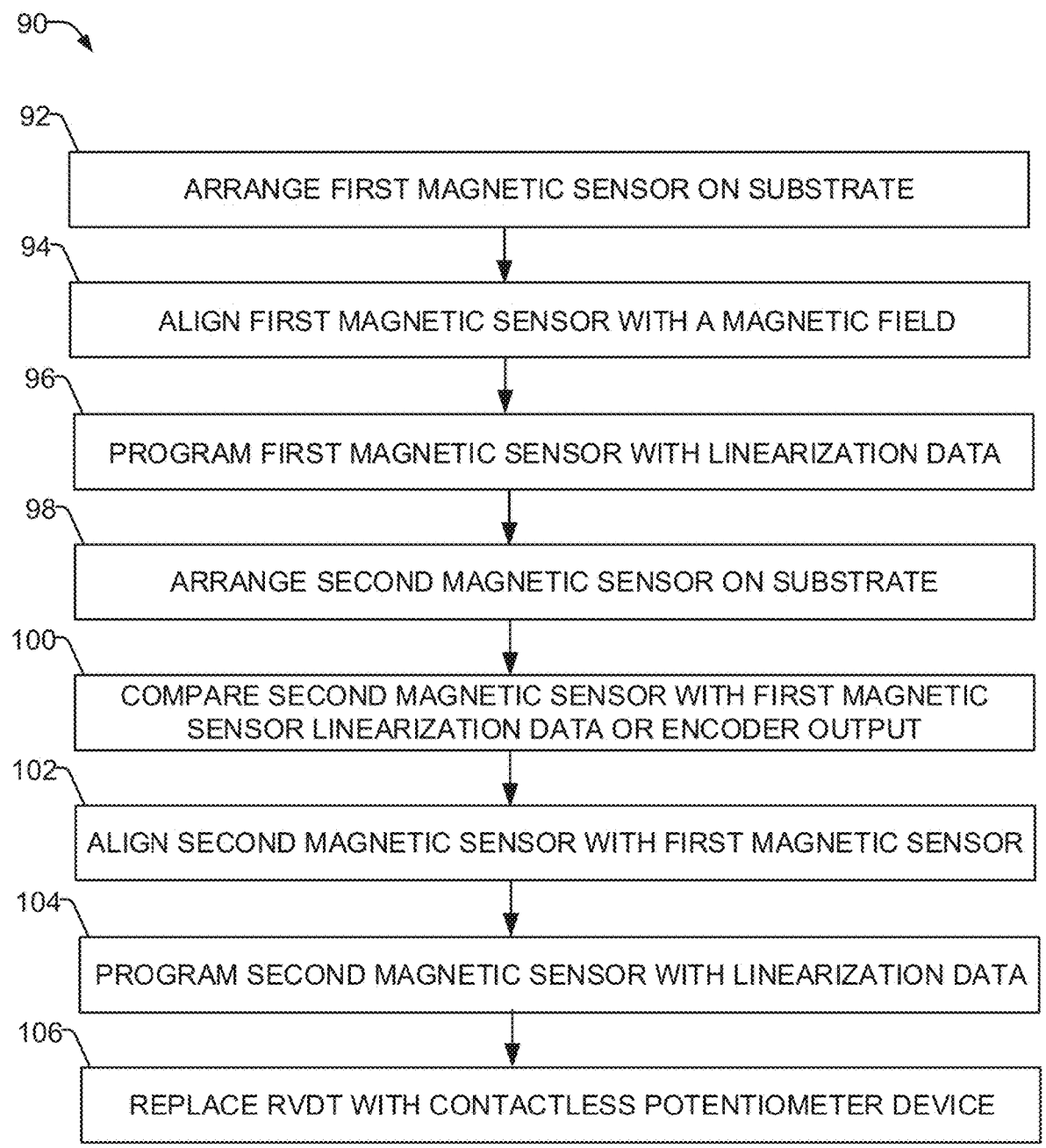
FIG. 7 illustrates an example method of programming a contactless potentiometer device comprising multi-channel sensors, in accordance with an example embodiment of the disclosure.

FIG. 7 illustrates an example method 90 of programming a contactless potentiometer device (e.g., device 10) to align each sensor (e.g., sensors 12A-12C) electrically and thereby to provide output within a desired accuracy band. In block 92, a first magnetic sensor (e.g., a Hall Effect sensor) is placed on a substrate (e.g., PCB 20A-20C) on a test stand. An output of the first magnetic sensor is compared with an encoder output, which provides a shaft angle. In block 94, the first magnetic sensor is aligned with a magnetic field (e.g., from magnet 26) corresponding to a given rotation angle of a rotatable control device (e.g., a rotatable shaft 14 of a sidestick application). For example, the sensor can be rotated to a given point using the encoder stand, and this point can be written into memory on circuitry of the respective sensor as a linearization point.

In block 96, the first magnetic sensor is programed with the linearization data corresponding to the given rotation angle (e.g., stored in a memory of the magnetic sensor circuit). In some examples, the sensor channels are individually programmed with a particular linearization scheme (e.g., a linearization scheme provided in a programming GUI).

Having programmed the first channel of the first magnetic sensor, a second channel of a second magnetic sensor can be electrically aligned to the first channel. Thus, in block 98, a second magnetic sensor (e.g., a Hall Effect sensor) is placed on a substrate (e.g., PCB 20A-20C) on a test stand. An output of the second magnetic sensor is compared with one or both of the encoder output (corresponding to shaft angle) or linearization data from the first magnetic sensor in block 100. In block 102, the second magnetic sensor is aligned with the magnetic field. This can be accomplished by rotating the shaft angle to the electrical zero, and programming this as the electrical zero of the second magnetic sensor channel. Thus, the second magnetic sensor is programmed with linearization data corresponding to the given rotation angle relative to the second magnetic sensor's position and/or the linearization data of the first magnetic sensor in block 104. Additionally or alternatively, the contactless potentiometer device can be used to replace a rotary variable differential transformer (RVDT) in block 106.

The method can be performed for another (e.g., a third) sensor or more if so desired, providing redundancy. Moreover, this process can be automated, thereby eliminating the need to manually align sensor channels to electrical zero.

Although several examples and/or embodiments are described with respect to Hall Effect sensors, the principles and/or advantages disclosed herein can employ technologies that are not limited to a particular type of sensor. For example, a magnetoresistive sensor and/or other types of contactless sensors may be employed. Further, although each of the plural (e.g., three) sensors of the disclosed examples are described as Hall Effect sensors, in some examples one or more of the plurality of sensors may be a first type of sensor, and another one or more of the plurality of sensors may be of a second type.

While the present disclosure has been described with reference to certain embodiments, it will be understood by those skilled in the art that various changes may be made and equivalents may be substituted without departing from the scope of the present disclosure. In addition, many modifications may be made to adapt a particular situation or material to the teachings of the present disclosure without departing from its scope. Therefore, it is intended that the present disclosure not be limited to the particular embodiment disclosed, but that the present disclosure will include all embodiments falling within the scope of the appended claims.

What is claimed is:

1. A contactless potentiometer device comprising:
   a first sensor mounted on a first substrate;
   a second sensor mounted on a second substrate, the first sensor and the first substrate being physically and electrically isolated from the second sensor and the second substrate, each sensor configured to measure change in a magnetic field, wherein each sensors comprises one or more electrically isolated output channels to provide an output signal to a control circuit corresponding to the change in the magnetic field, wherein each sensor includes a magnetic sensor circuit having an independent differential input with respect to a reference input, and an independent differential output with respect to a reference output to provide a signal to a respective electrically isolated output channel; and
   a ring magnet positioned a first distance from the first sensor and a second distance from the second sensor, such that each of the sensors are coaxially aligned with a central magnetic axis of the magnetic field and within range of the magnetic field from the magnet.

2. The contactless potentiometer device of claim 1, wherein the plurality of sensors comprises one or more Hall Effect sensors.

3. The contactless potentiometer device of claim 1, wherein the output signal changes in proportion to a change to an input signal.

4. The contactless potentiometer device of claim 3, wherein each sensor detects a change in angle from a reference position based on a rotation of the magnet about the shaft.

5. The contactless potentiometer device of claim 1, wherein the first and second substrates are first and second printed circuit boards (PCBs).

6. The contactless potentiometer device of claim 5, wherein the first and second PCBs are physically separated by one or more spacers to maintain a predetermined distance between the first and second PCBs, each PCB having the magnetic sensor circuit.

7. The contactless potentiometer device of claim 5, wherein the first PCB is physically and electrically isolated from the second PCB by an air gap.

8. The contactless potentiometer device of claim 1, wherein the ring magnet is rotatable about a shaft.

9. The contactless potentiometer device of claim 1, further comprising a housing to contain the one or more sensors, the magnet, or the shaft, wherein rotational movement about the shaft is facilitated by one or more of ball bearings, bushings, tracks, or a rotary support structure.

10. The contactless potentiometer device of claim 9, wherein the housing includes a panel to provide access to the substrate, the one or more sensors, and/or the magnet.

11. The contactless potentiometer device of claim 10, wherein the housing comprises a material to block stray magnetic fields.

12. The contactless potentiometer device of claim 1, further comprising a third sensor mounted on a third substrate coaxially aligned with a central magnetic axis of the magnetic field and comprising one or more electrically isolated output channels to provide an output signal to the control circuit corresponding to the change in the magnetic field.

13. A rotary sensing device configured to sense changes in angle in a rotary sensor comprising:
   a first sensor mounted on a first substrate;
   a second sensor mounted on a second substrate, wherein the first substrate is physically separated from the second substrate by an air gap with a predetermined distance, each sensor configured to measure change in a magnetic field and be electrically isolated from another sensor, wherein each sensors comprises one or more electrically isolated output channels to provide a signal to a control circuit corresponding to the change in the magnetic field, wherein each sensor includes a magnetic sensor circuit having a multi-stage filter and a mid-point buffer at an output of each sensor to control output voltage and filter noise of the output voltage transmitted through a respective electrically isolated output channel; and
   a magnet positioned a first distance from the first sensor and a second distance from the second sensor, such that the sensors are within range of the magnetic field from the magnet, wherein each sensor is configured to detect a change in angle from a reference position based on a rotation of the magnet.

14. The rotary sensing device of claim 13, wherein each of the one or more sensors are spaced apart from one another by the predetermined distance.

15. The rotary sensing device of claim 13, wherein the magnet is a ring magnet.

16. The rotary sensing device of claim 13, wherein each of the one or more sensors further comprises:
   a power input to receive a DC voltage; and
   an output channel to provide a signal to the control circuit corresponding to the change in the magnetic field.

17. The rotary sensing device of claim 13, wherein each of the sensors are coaxially aligned with a central magnetic axis of the magnetic field, the first sensor being separated from the second sensor by the air gap at the central magnetic axis.

18. A method of programming a contactless potentiometer device comprising:
   arranging a first magnetic sensor on a first substrate;
   aligning the first magnetic sensor coaxially with a central magnetic axis of a magnetic field corresponding to a given rotation angle of a rotatable control device;
   programming the first magnetic sensor with linearization data corresponding to the given rotation angle;
   arranging a second magnetic sensor on a second substrate;
   aligning the second magnetic sensor coaxially with the first magnetic sensor and the central magnetic axis, the first magnetic sensor and the first substrate being physically and electrically isolated from the second magnetic sensor and the second substrate; and programming the second magnetic sensor with linearization data corresponding to the given rotation angle, wherein each sensors comprises one or more electrically isolated output channels to provide a signal to a control circuit corresponding to a change in the magnetic field wherein each sensor includes a magnetic sensor circuit having an independent differential input with respect to a reference input, and an independent differential output with respect to a reference output to provide the signal through a respective electrically isolated output channel.

19. The method of claim 18, further comprising replacing a rotary variable differential transformer (RVDT) with the contactless potentiometer device.

20. The rotary sensing device of claim 18, wherein the first substrate is electrically isolated from the second substrate.

* * * * *